United States Patent
Jing et al.

(10) Patent No.: US 11,387,731 B2
(45) Date of Patent: Jul. 12, 2022

(54) DC-DC CONVERTER WITH IMPROVED REGULATION ACCURACY

(71) Applicant: TEXAS INSTRUMENTS INCORPORATED, Dallas, TX (US)

(72) Inventors: Weibing Jing, Beijing (CN); Liang Zhang, Beijing (CN); Dan Li, Beijing (CN); Qi Yang, Beijing (CN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/546,481

(22) Filed: Aug. 21, 2019

(65) Prior Publication Data

US 2020/0301458 A1    Sep. 24, 2020

Related U.S. Application Data

(63) Continuation of application No. PCT/CN2019/078828, filed on Mar. 20, 2019.

(51) Int. Cl.
    *H02M 3/158* (2006.01)
    *H02M 3/156* (2006.01)
    *H02M 1/00* (2006.01)

(52) U.S. Cl.
    CPC ......... *H02M 3/156* (2013.01); *H02M 1/0003* (2021.05); *H02M 3/158* (2013.01)

(58) Field of Classification Search
    CPC .............................. H02M 3/156; H02M 3/158
    See application file for complete search history.

(56) References Cited

U.S. PATENT DOCUMENTS

| | | | |
|---|---|---|---|
| 7,372,238 B1 | 5/2008 | Tomiyoshi | |
| 7,710,084 B1* | 5/2010 | Guo | G01R 19/003 323/224 |
| 2004/0120094 A1* | 6/2004 | Satoh | H02M 3/156 361/160 |
| 2010/0194370 A1* | 8/2010 | Cheng | H02M 3/1588 323/285 |
| 2011/0260703 A1 | 10/2011 | Laur et al. | |
| 2012/0013321 A1* | 1/2012 | Huang | H02M 3/33523 323/282 |
| 2013/0223108 A1 | 8/2013 | Xu | |

(Continued)

FOREIGN PATENT DOCUMENTS

CN          108683334 A      10/2018

OTHER PUBLICATIONS

Search Report for PCT Application No. PCT/CN2019/078828, dated Dec. 10, 2019, 2 pages.
CN108683334A, Machine Translation, 13 pages.

*Primary Examiner* — Alex Torres-Rivera
(74) *Attorney, Agent, or Firm* — Mark A. Valetti; Charles A. Brill; Frank D. Cimino

(57) ABSTRACT

A converter system includes a first switch, a sample-and-hold unit configured to provide a comparison signal based on a feedback signal when the first switch is switched off, and hold the comparison signal independent from the feedback signal when the first switch is switched on, and a pulse-width-modulation (PWM) generator, coupled between the sample-and-hold unit and first switch, configured to generate a PWM signal based on the comparison signal, wherein the first switch is configured to be switched on and off based on the PWM signal.

7 Claims, 5 Drawing Sheets

(56) References Cited

U.S. PATENT DOCUMENTS

| | | | |
|---|---|---|---|
| 2015/0333611 A1* | 11/2015 | Lakkimsetti | H02M 3/156 323/271 |
| 2016/0172967 A1* | 6/2016 | Ogawa | H02M 3/04 323/234 |
| 2019/0238124 A1* | 8/2019 | Tajima | G01R 19/32 |
| 2020/0301458 A1* | 9/2020 | Jing | H03F 3/45475 |

* cited by examiner

US 11,387,731 B2

DC-DC CONVERTER WITH IMPROVED REGULATION ACCURACY

TECHNICAL FIELD

The present disclosure relates to integrated circuits and, more particularly, to a DC-DC converter system with improved regulation accuracy.

BACKGROUND

DC-DC converters are widely used to convert an input DC voltage from a source to a desired output DC voltage to drive a load. The source of the input DC voltage may or may not be well controlled, or the load may or may not be constant. Therefore, most DC-DC converters regulate the output voltage, for example, based on a difference between a feedback signal proportional to the output voltage and a reference signal to ensure a stable output voltage.

SUMMARY

The present disclosure relates to integrated circuits and, more particularly, to a DC-DC converter system with improved regulation accuracy. A DC-DC converter system, for example, a switch mode DC-DC converter, usually includes a switch operated between on and off based on a frequency signal, for example, a pulse-width-modulation (PWM) signal, to generate an output DC voltage to a load by periodically storing energy from a source that provides an input DC voltage in a magnetic field of an inductor or a transformer and releasing the energy from the magnetic field. The ratio between the output DC voltage and the input DC voltage is proportional to the duty cycle of the PWM signal.

In one example, the present disclosure provides a converter system including a first switch, a sample-and-hold unit configured to provide a comparison signal based on a feedback signal when the first switch is switched off, and hold the comparison signal independent from the feedback signal when the first switch is switched on, and a PWM generator, coupled between the sample-and-hold unit and first switch, configured to generate a PWM signal based on the comparison signal, wherein the first switch is configured to be switched on and off based on the PWM signal.

In another example, the present disclosure provides a method of operating a converter system. The method includes: switching on and off a first switch of the converter system based on a PWM signal, sampling a feedback signal and providing a comparison signal based on the feedback signal when the first switch is switched off, holding the comparison signal independent from the feedback signal when the first switch is switched on, and regulating the PWM signal based on the comparison signal.

DETAILED DESCRIPTION

The present disclosure relates to DC-DC converter systems with improved regulation accuracy.

Figure 1:
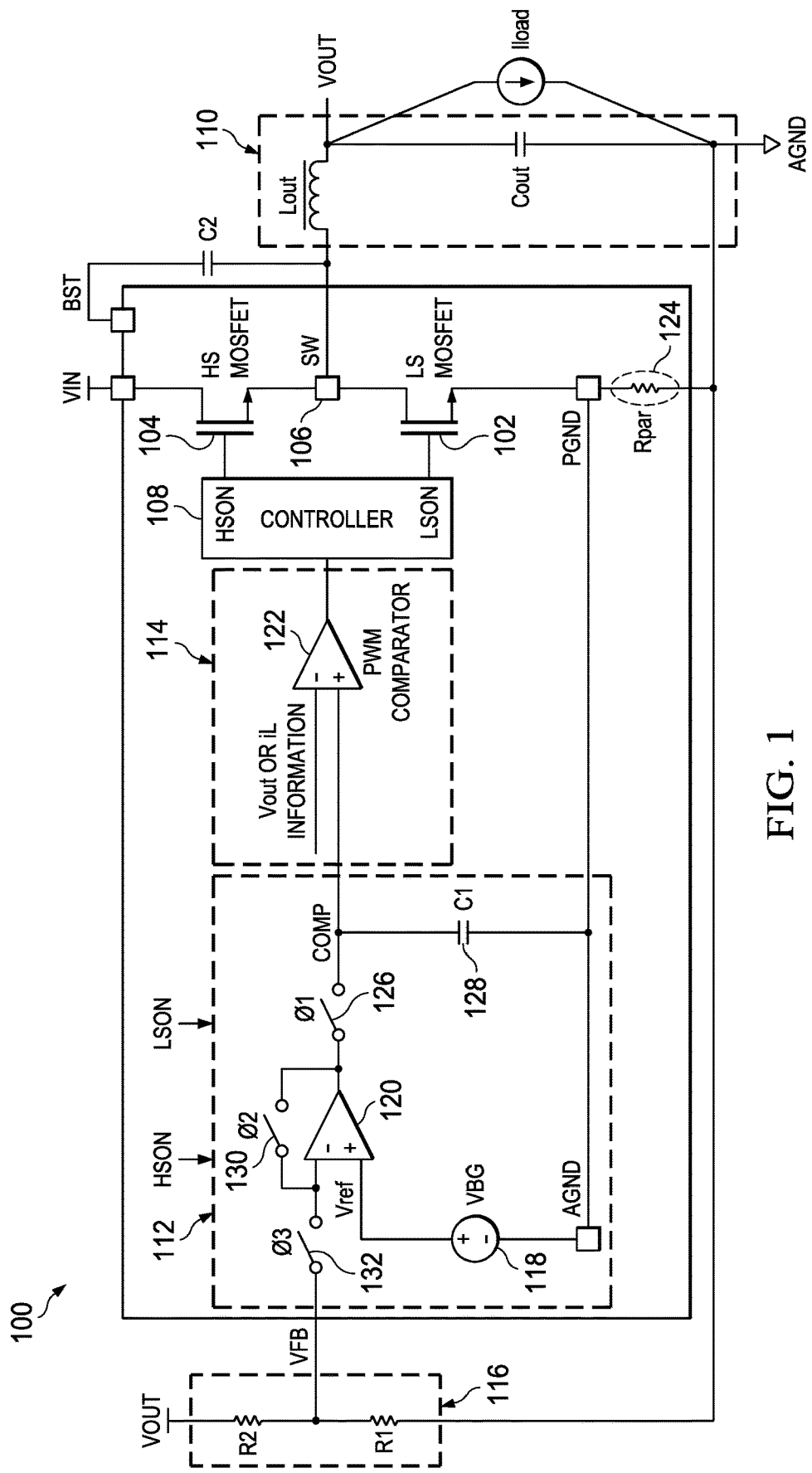
FIG. 1 is a schematic block diagram of a buck DC-DC converter system in accordance with an implementation of the present disclosure.

Referring now to FIG. 1, a schematic block diagram of a DC-DC converter system 100 in accordance with an implementation of the present disclosure is shown. The system 100 includes first and second switches 102 and 104 coupled in series at a switching node 106, wherein the first switch 102, coupled between the switching node 106 and a power ground PGND, is a low side switch of the DC-DC converter system 100, and the second switch 104, coupled between the input voltage VIN and the switch node 106, is a high side switch of the DC-DC converter system 100. In one implementation, the DC-DC converter system 100 is configured to work as a buck DC-DC converter for converting an input signal, for example, an input voltage VIN, to an output signal, for example, an output voltage VOUT lower than the input voltage VIN.

The DC-DC converter system 100 includes a controller 108 configured to reciprocally switch on and off the first and second switches 102 and 104 through first and second control signals LSON and HSON to generate a switching signal SW at the switch node 106. In a preferred implementation, the controller 108 generates the first and second control signals HSON and LSON based on a pulse-width-modulation signal (PWM) that has a duty cycle determined based on a ratio between the output voltage VOUT and the input voltage VIN. An output circuit 110 is coupled between the switch node 106 and an analog ground AGND for outputting the output voltage VOUT based on the input voltage VIN and the switching signal SW. The controller 108 can be an on-chip micro control unit (MCU) (or microcontroller) of the DC-DC converter system 100, or a logic unit. The first switch 102 can be a low side metal-oxide-semiconductor field-effect transistor (MOSFET) that has a drain node coupled to the switch node 106, a source node coupled to the power ground PGND and a gate terminal coupled to the controller 108 for receiving the first control signal LSON. The second switch 104 can be a high side MOSFET that has a drain terminal coupled to the input voltage VIN, a source terminal coupled to the switch node 106 and a gate terminal coupled to the controller 108 for receiving the second control signal HSON.

The DC-DC converter system 100 further includes a sample-and-hold unit 112 configured to provide a comparison signal COMP based on a difference between a feedback signal VFB and a reference voltage Vref, and a PWM generator 114 coupled between the sample-and-hold unit 112 and the controller 108.

The feedback signal VFB is generated by a feedback circuit 116 in proportion to the output voltage VOUT, and the reference voltage Vref is generated by a voltage source 118. In an example, the sample-and-hold unit 112 includes an amplifier 120, e.g. an error amplifier, configured to generate the comparison signal COMP based on the difference between the feedback signal VFB and the reference voltage Vref.

The PWM generator 114 includes a comparator 122 that generates and regulates the PWM signal based on a difference between the comparison signal COMP and information of the output voltage VOUT or an output current Iload through a load coupled to the output circuit 110. The information of the output voltage VOUT or the output current Iload can be a ramp signal generated based on VOUT or Iload. The comparator 122 generates the PWM signal by comparing the comparison signal COMP with the ramp signal that includes the information of the output voltage VOUT or the output current Iload.

In some situations, the voltage source 118 generates a bandgap voltage VBG with reference to an analog ground AGND, and due to pin account limitation, elements in the DC-DC converter system 100 such as the first switch 102 shares the power ground PGND with the analog ground AGND. When the first switch 102 is switched on, a current flowing through the first switch 102 results in a voltage drop across a ground pin parasitic resistor Rpar 124 located between the power ground PGND and the analog ground AGND, pulling down the reference voltage Vref, which affects the accuracy of the regulation. For example, when the output current Iload through a load coupled to the DC-DC converter system 100 is increasing, the output voltage VOUT will decrease due to the regulation performed based on a decreasing reference voltage Vref'.

In accordance with an implementation of the present disclosure, the sample-and-hold unit 112 is configured to be operated based on at least one of the first and second control signals LSON and HSON, such that the sample-and-hold unit 112 samples the feedback signal VFB and provides the comparison signal COMP based on the feedback signal VFB when the first switch 102 is switched off, and holds the comparison signal COMP independent from the feedback signal VFB when the first switch 102 is switched on.

In a preferred implementation, the sample-and-hold unit 112 further includes a third switch (Ø1) 126 coupled between the output terminal of the amplifier 120 and an output terminal of the sample-and-hold unit 112, and a signal retainer 128 coupled between the third switch 126 and output terminal of the sample-and-hold unit 112. In a preferred implementation, the signal retainer 128 is a capacitive element C1 having a first end coupled between the amplifier 120 and the output terminal of the sample-and-hold unit 112, and a second end coupled to the power ground PGND. In an example, when the first control signal LSON switches off the first switch 102, for example, the first control signal LSON is de-asserted, the third switch 124 is switched on to electrically couple the output terminal of the amplifier 120 to the PWM generator 114 and stores the comparison signal COMP in the signal retainer 128 by charging the capacitive element C1. When the first control signal LSON switches on the first switch 102, for example, the first control signal LSON is asserted, the third switch 124 is switched off to disconnect the amplifier 120 from the output terminal of the sample-and-hold unit 112 and the signal retainer 128, and the signal retainer 128 holds and provides the comparison signal COMP previously generated to the PWM generator through the output terminal of the sample-and-hold unit 112.

In a preferred implementation, the sample-and-hold unit 112 also includes a fourth switch (Ø2) 130 coupled between the output terminal and a first input terminal of the amplifier 120, wherein the fourth switch 130 is configured to be operated opposite to the third switch (Ø1) 126, to hold the comparison signal COMP previously generated when the first switch 102 is switched off at the output terminal of the amplifier 120 when the first switch 102 is switched on.

The sample-and-hold unit 112 preferably further includes a fifth switch (Ø3) 132 coupled between the first input terminal of the amplifier 120 and an input terminal of the sample-and-hold unit 112 that receives the feedback signal VFB, wherein the fifth switch 128 is configured to be operated same as the third switch 126 to forward the feedback signal VFB to the amplifier 120 when the first switch 102 is switched off, and disconnect the amplifier 120 from the feedback signal VFB when the first switch 102 is switched on. In a preferred implementation, the fifth switch 132 can be replaced with a wire. The third to fifth switches 126, 130 and 132 can be transistors operated between ON and OFF status respectively controlled by one of the first and second control signals HSON and LSON.

Figure 2:
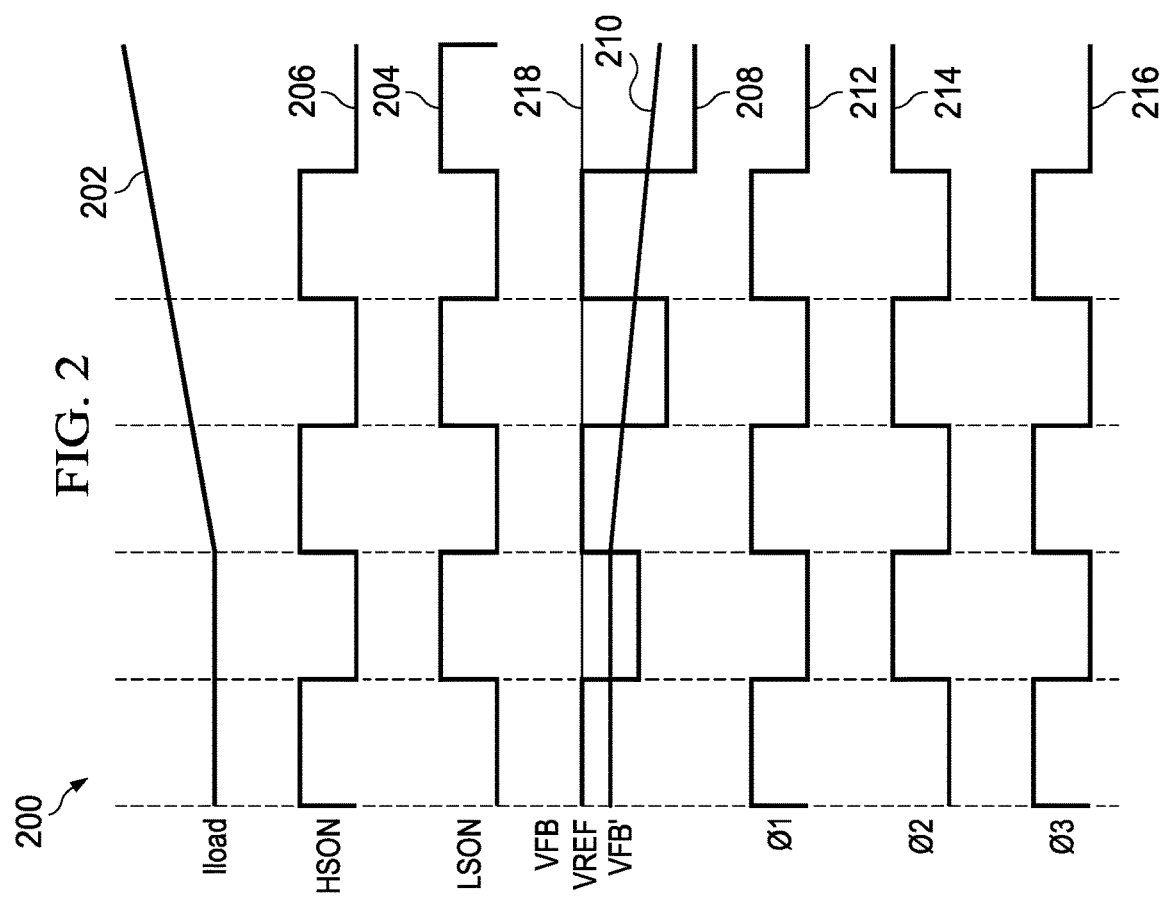
FIG. 2 is a timing diagram of the buck DC-DC converter system of FIG. 1 in accordance with an implementation of the present disclosure.

FIG. 2 is a timing diagram 200 of the DC-DC converter system 100 of FIG. 1 in accordance with an implementation of the present disclosure. The timing diagram 200 demonstrates the output current Iload at 202 that is increasing after a first cycle, the first and second control signals LSON and HSON at 204 and 206 that reciprocally switches on and off the first and second switches 102 and 104, the reference voltage Vref at 208 that remains at a voltage defined by the voltage source VGB when the first switch 102 is switched off and drops with the increasing of the output current Iload when the first switch 102 is switched on, a feedback voltage VFB' at 210 that is decreasing due to the variation of the reference voltage Vref in an absence of the first to third switches 126, 130 and 132 and the signal retainer 128, status of the third to fifth switches (Ø1-Ø3) 126, 130 and 132 at 212 to 216, and the feedback voltage VFB at 218 that remains constant as the voltage defined by the voltage source VGB under the control of the third to fifth switches (Ø1-Ø3) 126, 130 and 132.

Figure 3:
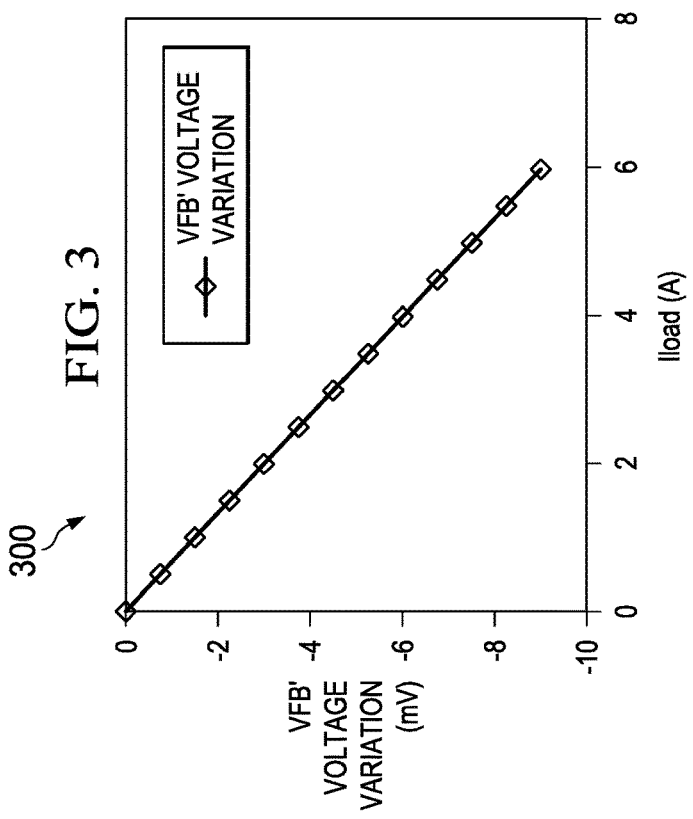
FIG. 3 is a simulation diagram illustrating variation of the feedback voltage with the increase of an output current of a DC-DC converter system in an absence of a switching unit.

FIG. 3 is a simulation diagram 300 illustrating variation of the feedback voltage VFB with the increase of an output current Iload through a load of a DC-DC converter system in an absence of the switching unit 120. The simulation diagram 300 demonstrates a dropping of the feedback voltage VFB' with an increasing of the output current Iload.

Figure 4:
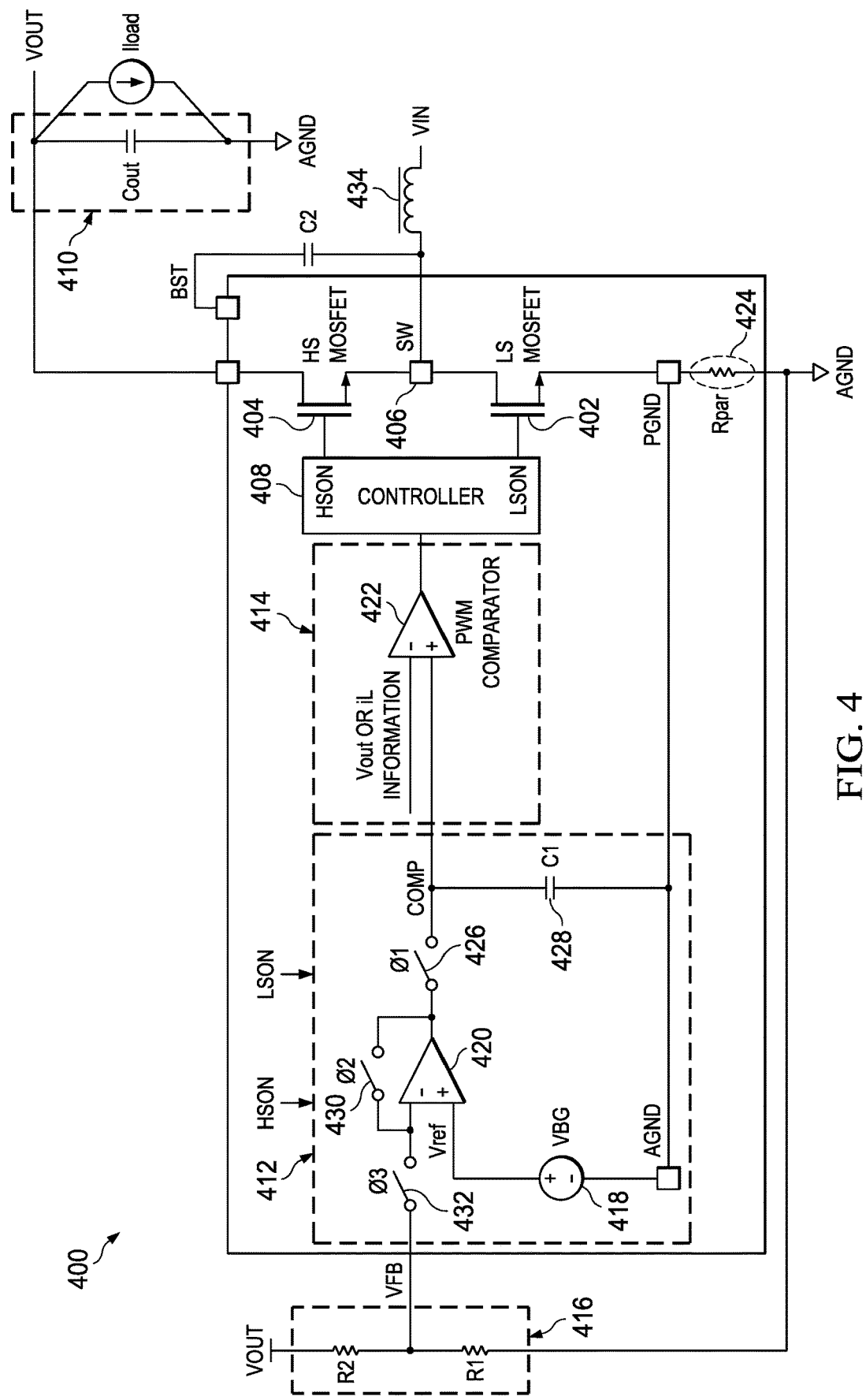
FIG. 4 is a schematic block diagram of a boost DC-DC converter system in accordance with another implementation of the present disclosure.

FIG. 4 is a schematic block diagram of a boost DC-DC converter system 400 in accordance with another implementation of the present disclosure. The boost DC-DC converter system 400 is substantially same as the buck DC-DC converter system 100 of FIG. 1 except that the converter system 400 receives an input voltage VIN at the switching node 406 between the first and second switches 402 and 404 through an input circuit 434 and outputs an output voltage VOUT higher than the input voltage VIN at the drain terminal of the second switch 404 through an output circuit 410.

Figure 5:
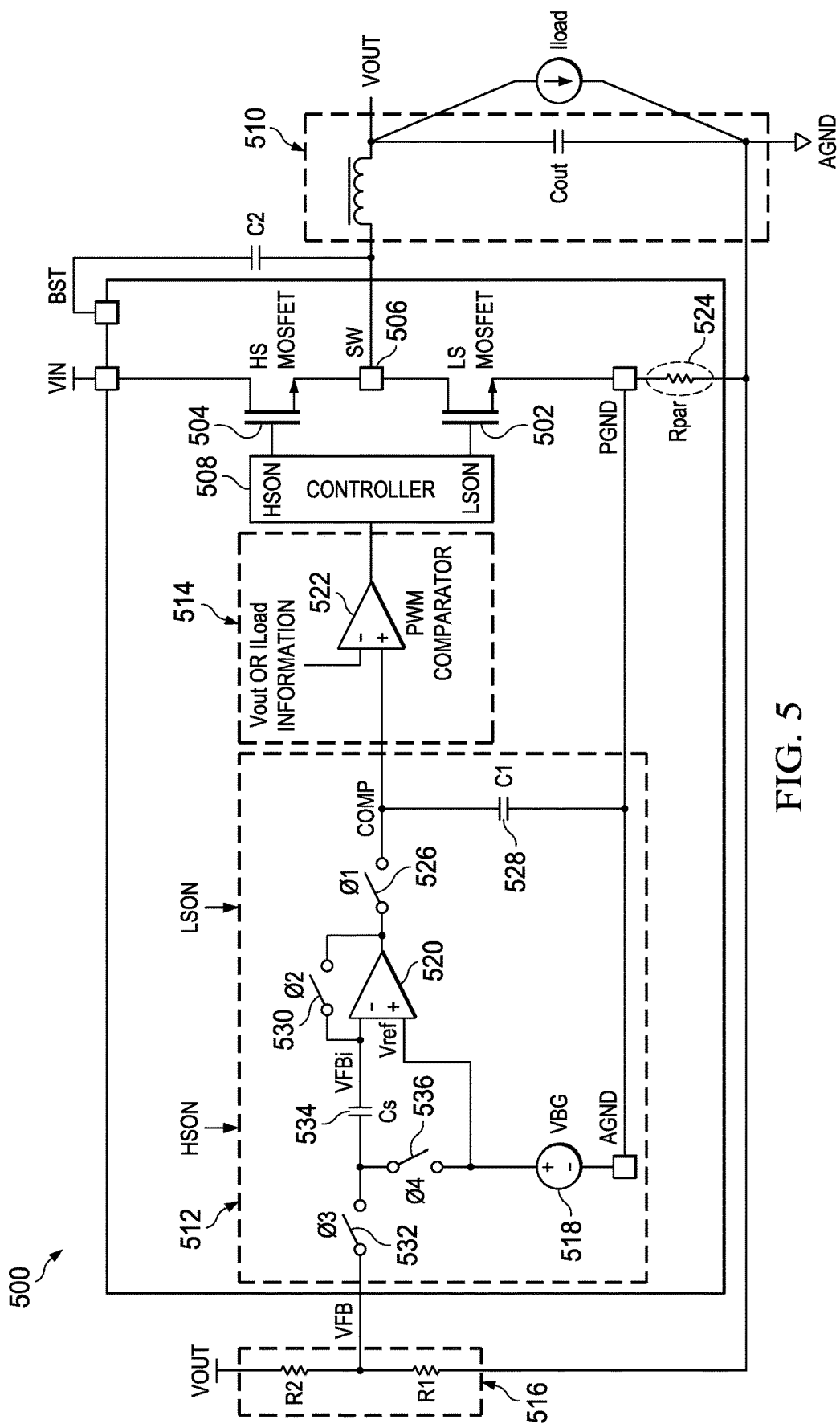
FIG. 5 is a schematic block diagram of a buck DC-DC converter system in accordance with yet another implementation of the present disclosure.

FIG. 5 is a schematic block diagram of a DC-DC converter system 500 in accordance with yet another implementation of the present disclosure. The DC-DC converter system. 500 is substantially same as the DC-DC converter system 100 of FIG. 1 except that the sample-and-hold unit 512 further includes a capacitive element 534 with a first end coupled to the first input terminal of the amplifier 520 and an opposite second end coupled to the fifth switch 532, and a sixth switch 536 coupled between the second end of the capacitive element 534 and a second input terminal of the amplifier 520. Affected by process or environmental factors, there might be an offset voltage between the first and second input terminals of the amplifier 520, which affects the accuracy of the regulation. In a preferred implementation, when the first switch 502 is switched on, the amplifier 520 is disconnected from the feedback voltage VFB, the sixth switch 536 electrically couples the capacitive element 534 between the first and second input terminals of the amplifier 520 to determine the offset voltage between the first and second input terminals of the amplifier 520 by charging the capacitive element 534 with the offset voltage, and when the first switch 502 is switched off, the amplifier 516 is configured to generate the comparison signal COMP based on the feedback signal VFB, the sixth switch 536 is switched off and the fifth switch 532 is switched on, the offset voltage is compensated to the feedback voltage VFB and a compensated feedback voltage VFBi is provided to the first input of the amplifier 520 to further improve the regulation accuracy.

Figure 6:
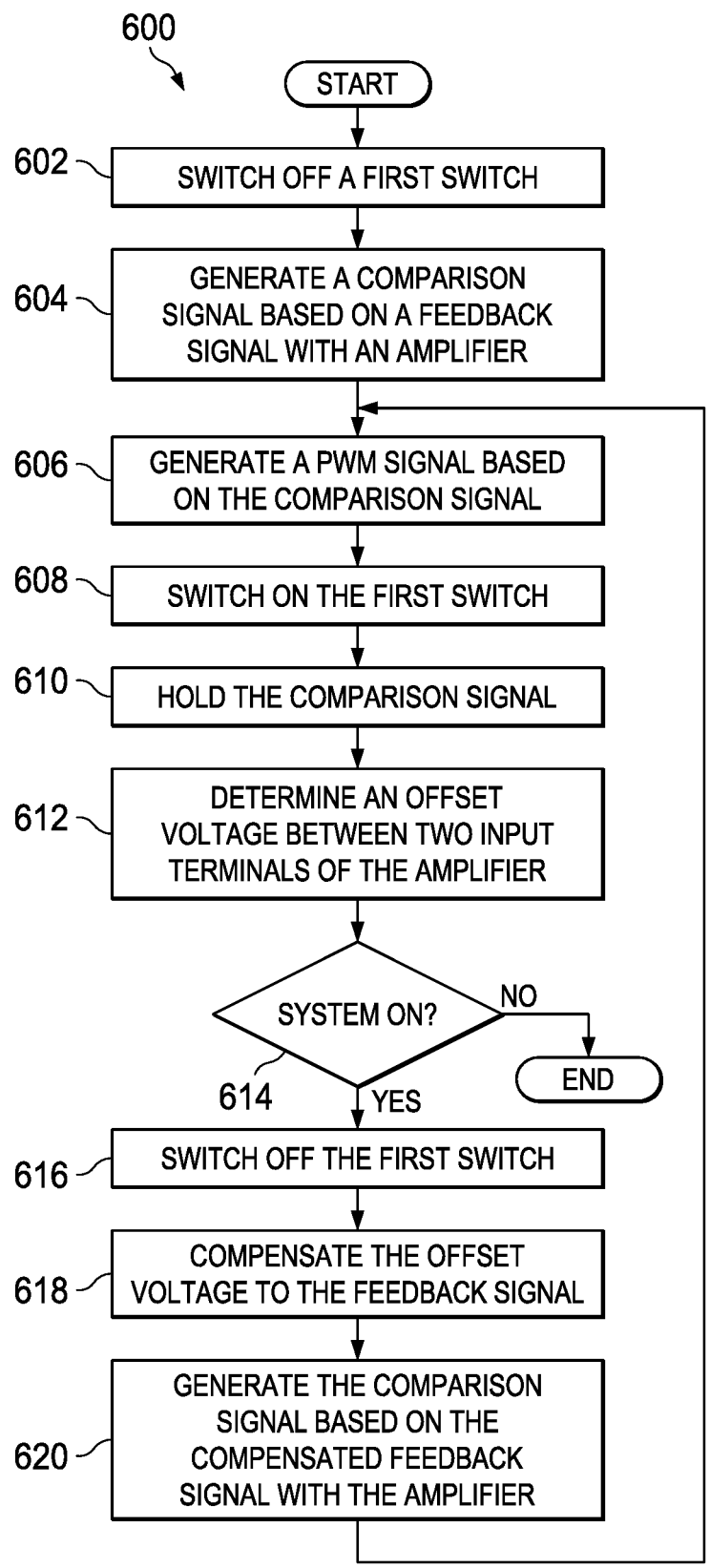
FIG. 6 is a flow chart of a method of operating a DC-DC converter system in accordance with an implementation of the present disclosure.

Referring to FIG. 6, a flow chart of a method 600 for regulating a DC-DC converter system in accordance with an implementation of the present disclosure is shown. With reference to the DC-DC converter system 500 of FIG. 5, the DC-DC converter system 500 operable between first and second phases for converting an input signal, e.g. an input voltage, to an output signal, e.g. an output voltage.

Starting at step 602, the controller 508 switches off the first switch 502. In one example, the controller 508 further switches on the second switch 504. In a preferred implementation, the first and second switches 502 and 504 are respectively controlled by the first and second control signals LSON and HSON generated by the controller 508.

At step 604, the sample-and-hold unit 512 samples a feedback signal VFB, generates a comparison signal COMP based on a difference between the feedback signal and a reference voltage Vref, and stores the comparison signal COMP in the signal retainer 528. In a preferred implementation, the third and fifth switches 526 and 532 are switched on, and the fourth switch 530 is switched off. In an example, the signal retainer 528 is a capacitive element C1 coupled between the output terminal of the sample-and-hold unit 512 and the power ground PGND.

At step 606, the PWM generator 514 generates and regulates the PWM signal based on the comparison signal COMP and information of the output voltage VOUT or the output current Iload. For example, the comparator 518 generates the PWM signal by comparing the comparison signal COMP with a ramp signal that includes the information of the output voltage VOUT or the output current Iload.

At step 608, the controller 508 switches on the first switch 502 and switches off the second switch 504 through the first and second control signals LSON and HSON based on the PWM signal.

At step 610, the sample-and-hold unit 512 holds the previously generated comparison signal COMP at the output terminal thereof. The signal retainer 528 is disconnected from the amplifier 520 and holds the comparison signal COMP. The third and fifth switches 526 and 532 are switched off. Therefore, when the first switch 502 is switched on, with the increasing of the output current Iload, the regulation accuracy will not be affected by the voltage drop on the ground pin parasitic resistor Rpar 524 located between the power ground PGND and the analog ground AGND that will pull down the reference voltage Vref. In a preferred implementation, the fourth switch 530 is switched on to hold the comparison signal COMP at the output terminal of the amplifier 520.

At step 612, with reference to the DC-DC converter system 500 of FIG. 5, in a preferred implementation the sixth switch 536 is switched on to electrically couple the capacitive element 530 between the first and second input terminals of the amplifier 516. The offset voltage between the first and second input terminals of the amplifier 516 is obtained by charging the offset voltage to the capacitive element 530.

If the DC-DC converter system 500 is still on, determined at step 614, moving on to step 616. Step 616 is same as the step 602, the controller 508 switches off the first switch 102 and switches on the second switch 104 based on the PWM signal. The step 614 can be located between any two of the steps in the flow chart.

At step 618, the sixth switch 536 is switched off and the fifth switch 532 is switched on to couple the capacitive element 530 between the feedback voltage VFB and the first input terminal of the amplifier 520 to compensate the offset voltage to the feedback voltage VFB, and a compensated feedback voltage VFBi is provided to the first input of the amplifier 520 to further improve the regulation accuracy.

At step 620, similar to the step 604, the sample-and-hold unit 512 is configured to generate a comparison signal COMP based a difference between the compensated feedback signal VFBi and a reference voltage Vref, and store the comparison signal COMP in the signal retainer 528.

After step 620, the DC-DC converter system 500 moves back to the step 606.

The description of the preferred implementations of the present disclosure has been presented for purposes of illustration and description, but is not intended to be exhaustive or to limit the disclosure to the forms disclosed. Numerous modifications, changes, variations, substitutions, and equivalents will be apparent to those skilled in the art, without departing from the spirit and scope of the present disclosure, as described in the claims.

The invention claimed is:

1. A converter system having an input and an inductor connected between a switching node and an output, the converter system comprising:
   a first switch having a first control terminal, a first current terminal coupled to ground and a second current terminal connected to the switching node;
   a second switch having a second control terminal, a third current terminal connected to the input and a fourth current terminal connected to a switching node and the second current terminal;
   a sample-and-hold unit configured to provide a comparison signal based on a feedback signal that is representative of the output when the first switch is switched off and hold the comparison signal independent of the feedback signal when the first switch is switched on;
   a pulse-width-modulation (PWM) generator having an input coupled to the sample-and-hold unit and an output coupled to first control terminal and the second control terminal, configured to generate a PWM signal based on the comparison signal, wherein the first switch is configured to be switched on and off based on the PWM signal; and
   wherein the sample-and-hold unit includes:
      an amplifier configured to generate the comparison signal at an output terminal thereof based on the feedback signal received at a first input terminal and a reference signal received at a second input terminal;
      a third switch, coupled between the output terminal of the amplifier and the PWM generator, configured to electrically couple the output terminal of the amplifier to the PWM generator when the first switch is off; and
      a signal retainer, coupled between the third switch and the PWM generator, configured to receive and store the comparison signal when the first switch is switched off, and hold the comparison signal when the first switch is switched on.

2. The converter system of claim 1, the second switch is configured to be switched on and off reciprocally with the first switch.

3. The converter system of claim 2, further comprising a controller, coupled between the PWM generator and the first and second switches, configured to generate a control signal based on the PWM signal to reciprocally switch the first and second switches on and off.

4. The converter system of claim 1, wherein the sample-and-hold unit further comprises a fourth switch, coupled between the first input terminal and the output terminal of the amplifier, configured to hold the comparison signal previously generated when the first switch is switched off at the output terminal of the amplifier when the first switch is switched on.

5. The converter system of claim 4, wherein the sample-and-hold unit further comprises a fifth switch with a first end coupled to an input terminal of the sample-and-hold unit and an opposite second end coupled to the first input terminal of the amplifier, configured to receive and provide the feedback signal to the amplifier when the first switch is switched off, and disconnect the amplifier from the feedback signal when the first switch is switched on.

6. The converter system of claim 5, wherein the sample-and-hold unit further comprises:
a capacitive element with a first end coupled to the second end of the fifth switch and an opposite second end coupled to the first input terminal of the amplifier; and
a sixth switch coupled between the first end of the capacitive element and the second input terminal of the amplifier,
wherein the capacitive element is configured to store an offset voltage between the first and second input terminals of the amplifier through the sixth switch when the first switch is switched on, and compensate the feedback signal with the offset voltage through the fifth switch when the first switch is switched off.

7. A converter system having an input voltage and an output, the converter system comprising:
a pulse-width modulation (PWM) circuit having an input and a PWM signal output;
a first switch having a first control terminal coupled to the PWM signal output, a first current terminal coupled to ground and a second current terminal coupled to the output of the converter system;
a second switch having a second control terminal coupled to the PWM signal output, a third current terminal connected to the input voltage and a fourth current terminal connected to the second current terminal, wherein the second switch is configured to be switched on and off reciprocally with the first switch;
a sample and hold circuit having an input coupled to the output of the converter system and an output coupled to the PWM circuit, the sample and hold circuit is configured to provide a comparison signal based on a reference voltage and a feedback signal that is representative of the output of the converter system when the first switch is switched off and hold the comparison signal independent of the feedback signal when the first switch is switched on; and
wherein the sample and hold circuit includes:
an amplifier configured to generate the comparison signal at an output terminal thereof based on the feedback signal received at a first input terminal and a reference signal received at a second input terminal;
a third switch, coupled between the output terminal of the amplifier and the PWM circuit, configured to electrically couple the output terminal of the amplifier to the PWM circuit when the first switch is off; and
a signal retainer, coupled between the third switch and the PWM circuit, configured to receive and store the comparison signal when the first switch is switched off, and hold the comparison signal when the first switch is switched on.

* * * * *